(12) United States Patent
Mazur

(10) Patent No.: US 6,900,652 B2
(45) Date of Patent: May 31, 2005

(54) FLEXIBLE MEMBRANE PROBE AND METHOD OF USE THEREOF

(75) Inventor: Robert G. Mazur, Allegheny County, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 0 days.

(21) Appl. No.: 10/461,073

(22) Filed: Jun. 13, 2003

(65) Prior Publication Data

US 2004/0251923 A1 Dec. 16, 2004

(51) Int. Cl.[7] .......................... G01R 31/02; G01R 27/26
(52) U.S. Cl. ...................... 324/761; 324/671; 324/754
(58) Field of Search ................................ 324/754–761, 324/765, 158.1

(56) References Cited

U.S. PATENT DOCUMENTS

| | | | |
|---|---|---|---|
| 3,405,361 A | * 10/1968 | Kattner et al. | ............... 324/759 |
| 3,596,228 A | 7/1971 | Reed et al. | |
| 3,992,073 A | 11/1976 | Buchoff et al. | |
| 5,023,561 A | 6/1991 | Hillard | |
| 5,144,228 A | 9/1992 | Sorna et al. | |
| 5,225,771 A | 7/1993 | Leedy | |
| 5,583,445 A | 12/1996 | Mullen | |
| 5,585,736 A | 12/1996 | Hshieh et al. | |
| 5,767,691 A | 6/1998 | Verkuil | |
| 5,977,783 A | 11/1999 | Takayama et al. | |
| 6,084,420 A | 7/2000 | Chee | |
| 6,198,300 B1 | 3/2001 | Doezema et al. | |
| 6,294,922 B1 | 9/2001 | Okubo et al. | |
| 6,337,565 B1 | 1/2002 | Ito et al. | |
| 6,368,887 B1 | 4/2002 | Lowrey et al. | |
| 6,426,638 B1 | 7/2002 | Di Stefano | |
| 6,492,827 B1 | * 12/2002 | Mazur et al. | ............... 324/761 |
| 2002/0036514 A1 | 3/2002 | Taura et al. | |

* cited by examiner

*Primary Examiner*—Kamand Cuneo
*Assistant Examiner*—Paresh Patel
(74) *Attorney, Agent, or Firm*—Webb Ziesenheim Logsdon Orkin & Hanson, P.C.

(57) ABSTRACT

A measuring apparatus for measuring a semiconductor wafer, or a film or coating thereon, includes an electrically conductive wafer chuck and a probe having a probe body defining an internal cavity in fluid communication with an electrically conductive and elastic or resilient membrane. The membrane and a topside of the semiconductor wafer are moved into spaced relation when the semiconductor wafer is supported by the wafer chuck. A pressure of fluid supplied to the internal cavity of the probe body is selectively controlled whereupon the membrane expands into contact with the topside of the semiconductor wafer. A suitable test stimulus is applied to the membrane and the semiconductor wafer and the response of the semiconductor wafer to the test stimulus is measured.

16 Claims, 3 Drawing Sheets

FLEXIBLE MEMBRANE PROBE AND METHOD OF USE THEREOF

BACKGROUND OF THE INVENTION

1. Field of the Invention

This invention relates to an apparatus and method for measuring electrical properties of a semiconductor wafer, or a coating or film on the semiconductor wafer.

2. Description of Related Art

The determination of electrical properties of a semiconductor wafer, or a coating or film thereon, is a critical factor in the production of such wafers. In current standard practice, measurements of these electrical properties have been accomplished by first fabricating one or more metal or doped polysilicon contacts on the top surface. These contacts become part of a metal oxide semiconductor (MOS) or Schottky barrier structure that is used to make the appropriate measurement. In other words, these contacts become permanent features on the semiconductor wafer, or the coating or film thereon, thereby making the entire semiconductor wafer unfit for normal use. Thus, these contacts are only formed on monitor or test semiconductor wafers.

In addition, fabrication of the metal or polysilicon contacts is time-consuming and costly. It typically involves depositing and forming metal or polysilicon contacts on the surface of the semiconductor wafer in a manner known in the art.

An alternative to these fabricated contacts is described in an article entitled "Vacuum Operated Mercury Probe for CV Plotting and Profiling" by Albert Lederman, Solid State Technology, August 1981, pp. 123–126. This article discloses utilizing mercury contacts to replace aluminum or polysilicon contacts. More specifically, the Lederman article discloses a vacuum operated mercury probe for performing measurements of metal oxide semiconductors, homogeneous semiconductor wafers, non-homogeneous semiconductor wafers, and semiconductor wafers on insulating substrates. Problems may arise utilizing the Lederman mercury probe in that mercury may react chemically with the materials on the wafer under study. Mercury can also pose a significant safety problem in its use under some conditions. Thus, a mercury probe has limited application.

An alternative to fabricated contacts or vacuum operated mercury probes is disclosed in U.S. Pat. No. 5,023,561 to Hillard which issued on Jun. 11, 1991 and which is incorporated herein by reference.

The Hillard patent discloses a kinematic probe arm having at one end thereof a probe including a tip having a uniformly flat surface of predetermined dimensions. A probe stand supports the kinematic arm and a chuck supports the semiconductor wafer. The probe stand, the kinematic arm, and the chuck are configured so that a planar contact can be realized between the uniformly flat surface of the tip and the outer surface of the dielectric layer of the semiconductor wafer.

A problem with utilizing the probe disclosed in the Hillard patent for performing measurements is the need to grind the surface of the tip uniformly flat. Another problem is the need to establish a planar contact between the uniformly flat surface of the tip and the surface of the wafer. The use of a uniformly flat surface of the tip to form a planar contact with the outer surface of the wafer is particularly a problem with today's very thin oxide layers since a lack of perfect parallelism between the uniformly flat surface of the tip and the outer surface of the wafer may result in an edge surrounding the uniformly flat surface of the tip damaging the oxide layer.

In addition, when the Hillard patent was filed in the early 1990's, a typical gate oxide thickness in the semiconductor industry was on the order of hundreds of angstroms. The relatively small planar contact area between the uniformly flat surface of the tip of the probe and the outer surface of the dielectric layer of the wafer resulted in a poor capacitance signal-to-noise ratio when applied to these relatively thick oxides. In contrast, today gate oxides are very thin, on the order of 1.0–1.5 nm. With such thin oxides, the capacitance signal-to-noise ratio is increased whereby measurements made with conductive pressure contacts can be effectively utilized to characterize gate oxides.

An alternative to the use of the kinematic probe arm and the probe including a tip having a uniformly flat surface is disclosed in U.S. Pat. No. 6,492,827 to Mazur et al. which issued on Dec. 10, 2002 and which is incorporated herein by reference.

The Mazur et al. patent discloses the use of a probe having an elastically deformable conductive tip that is moveable into contact with a semiconducting material forming an outer surface of a semiconductor wafer, or with a dielectric formed on the outer surface of the semiconductor wafer. A test apparatus applies a stimulus between the conductive tip and the semiconductor wafer and measures a response of the semiconductor wafer and, if provided, the dielectric formed on the front surface thereof for determining at least one electrical property of the semiconducting material of the semiconductor wafer and/or the dielectric.

The contact force between the probe tip of the probe disclosed in the Mazur et al. patent and the wafer must be controlled to avoid damaging the semiconducting material and/or the dielectric of the semiconductor wafer. This is especially important when the probe tip is utilized to contact the very thin gate oxides on today's semiconductor wafers.

It is, therefore, desirable to provide a probe having a tip wherein the contact force between the tip and the topside of the semiconductor wafer can be more accurately controlled. Still other desirable features will become apparent to those of ordinary skill in the art upon reading and understanding the following detailed description.

SUMMARY OF THE INVENTION

The invention is a measurement apparatus that includes an electrically conductive wafer chuck for supporting the backside of a semiconductor wafer and a probe having a probe body defining an internal cavity in fluid communication with an electrically conductive and elastic or resilient membrane. The apparatus includes means for moving the membrane and a topside of the semiconductor wafer into spaced relation when the wafer chuck is supporting the semiconductor wafer. A means is provided for selectively providing pressurized fluid, e.g., a gas or a liquid, to the cavity whereupon, in response to increasing the pressure of the fluid sufficiently, the membrane expands into contact with the topside of the semiconductor wafer. A means is provided for applying a test stimulus to the membrane and the semiconductor wafer. Lastly, means is provided for measuring the response of the semiconductor wafer to the test stimulus.

The force and/or the contact area of the membrane in contact with the semiconductor wafer can be related to the pressure of the fluid. In response to decreasing the pressure of the fluid, the resiliency of the membrane causes it to contract away from the topside of the semiconductor wafer.

The probe body or the fluid can be electrically conductive and the membrane can be electrically connected to the test stimulus applying means or the measuring means via the probe body or the fluid.

An electrical conductor can at least partially surround the probe body in spaced relation thereto. A biasing means can bias the electrical conductor to a desired electrical potential. An electrical insulator can be disposed between the electrical conductor and the probe body for maintaining the electrical conductor in spaced relation to the probe body.

The invention is also a method of testing a semiconductor wafer that includes (a) providing a probe having a probe body defining an internal cavity in fluid communication with an electrically conductive and elastic or resilient membrane; (b) positioning the membrane in spaced relation with a topside of a semiconductor wafer; (c) providing fluid to the cavity at a pressure sufficient to cause the membrane to expand into contact with the topside of the semiconductor wafer; (d) applying a test stimulus between the membrane and the semiconductor wafer; and (e) measuring a response of the semiconductor wafer to the test stimulus.

The method can also include reducing the pressure of the fluid provided to the cavity sufficiently whereupon the elasticity of the membrane causes it to contract out of contact with the topside of the semiconductor wafer.

DETAILED DESCRIPTION OF THE INVENTION

The present invention will be described with reference to the accompanying figures wherein like reference numbers correspond to like elements.

Figure 1:
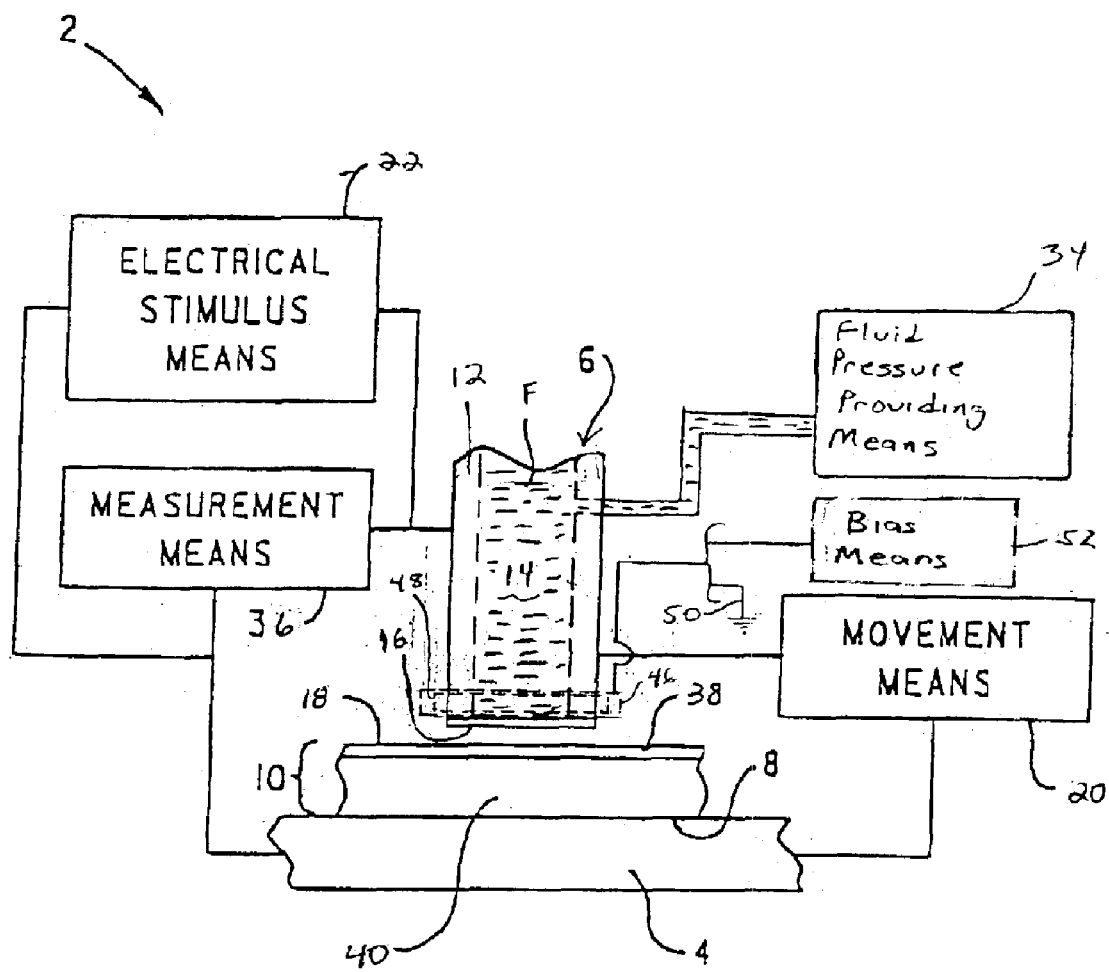
FIG. 1 is a schematic illustration of a semiconductor wafer testing apparatus having a probe that includes an elastic or resilient membrane attached to the distal end thereof.

With reference to FIG. 1, a semiconductor wafer testing apparatus 2 includes an electrically conductive chuck 4 and a measurement probe 6. Chuck 4 is configured to support a backside 8 of a semiconductor wafer 10. Probe 6 has a probe body 12 defining a sealed internal cavity 14 that is in fluid communication with an electrically conductive and elastic or resilient membrane 16 affixed to a distal end of probe body 12. A movement means 20 can be connected to chuck 4, probe 6 or both for moving membrane 16 and a topside 18 of semiconductor wafer 10 into spaced relation.

Figure 2:
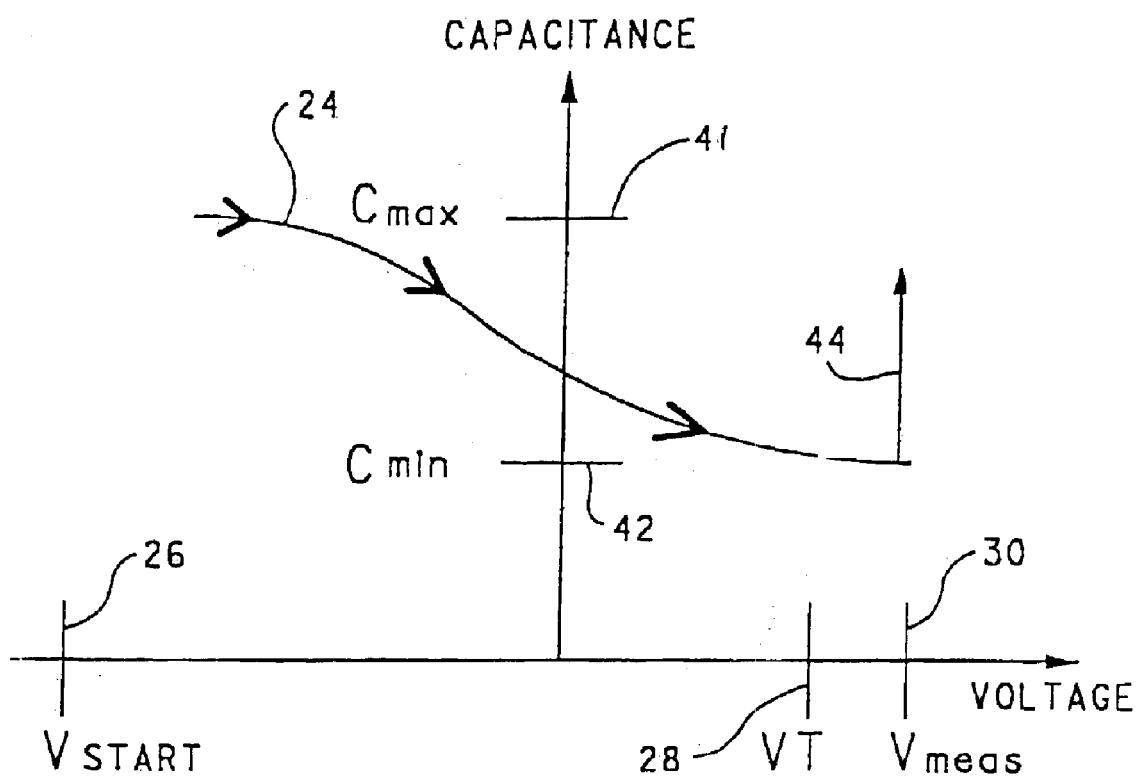
FIG. 2 is a graph of capacitance versus voltage for a capacitor formed by the membrane in contact with the semiconductor wafer in FIG. 1.

An electrical stimulus means 22 is electrically connected between chuck 4 and membrane 16 for applying a suitable test stimulus to semiconductor wafer 10 when it is received on chuck 4 and membrane 16 is moved into contact with topside 18 of semiconductor wafer 10 in a manner to be described hereinafter. One suitable test stimulus is a CV-type electrical stimulus 24 of the type shown in FIG. 2 wherein a DC voltage having an AC voltage (not shown) superimposed thereon is swept from a first voltage ($V_{START}$) 26, which is less than a threshold voltage ($V_T$) 28 of semiconductor wafer 10, to a second voltage ($V_{MEAS}$) 30 which is greater than $V_T$ 28. Methods of CV-type measurements are well known in the art. The DC voltage is swept slowly enough to allow for minority carrier generation in the semiconductor material underlying the contact between membrane 16 and semiconductor wafer 10. CV-type electrical stimulus 24 is for semiconductor wafer 10 formed from P-type silicon. A mirror-image of CV-type electrical stimulus 24 would be utilized for semiconductor wafer 10 formed from N-type silicon.

Apparatus 2 includes a fluid pressure providing means 34, such as a suitable fluid pump, which is fluidly coupled to internal cavity 14 of probe body 12 for selectively increasing and decreasing a pressure of a fluid, either gas or liquid, inside internal cavity 14. A measurement means 36 is connected between chuck 4 and membrane 16 for measuring a response of semiconductor wafer 10 to the test stimulus and for determining from this measurement a characteristic of semiconductor wafer 10.

Semiconductor wafer 10 can include a dielectric 38 overlaying a semiconductor material 40. Thus, topside 18 of semiconductor wafer 10 is the side of dielectric 38 opposite semiconductor material 40.

Membrane 16 can be formed of any suitable material that is electrically conductive and elastic or resilient. One suitable material is an electrically conductive and elastic or resilient polymer.

Figure 3:
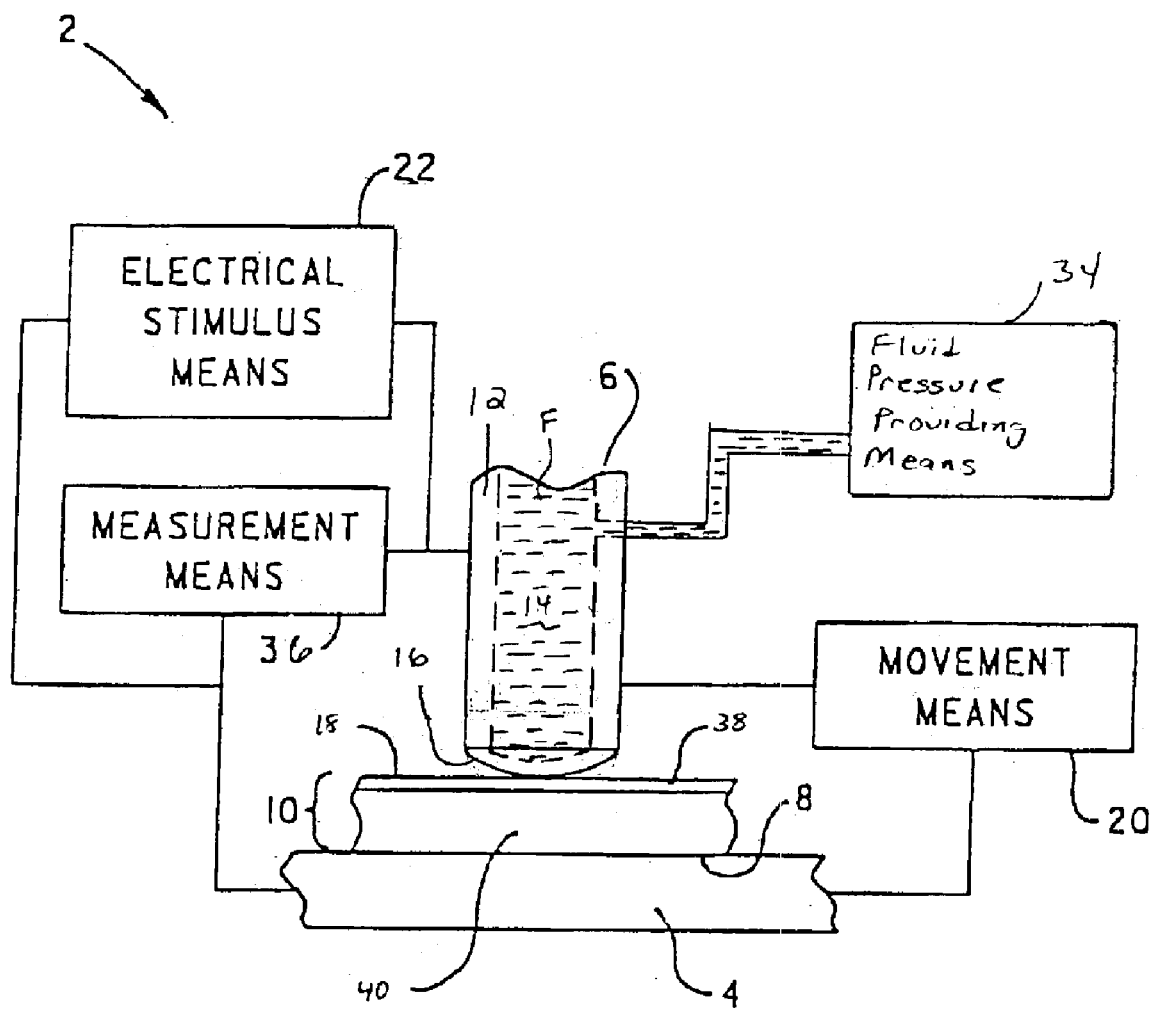
FIG. 3 is a schematic illustration of the semiconductor wafer testing apparatus shown in FIG. 1 with the elastic or resilient membrane in contact with the topside of a semiconductor wafer.

With reference to FIG. 3, and with continuing reference to FIG. 1, in response to fluid pressure providing means 34 providing a fluid F to internal cavity 14 at a pressure sufficient to overcome its resiliency, membrane 16 expands into contact with topside 18 of semiconductor wafer 10. When topside 18 of semiconductor wafer 10 includes dielectric 38, the contact between membrane 16 and topside 18 forms a capacitor wherein membrane 16 defines a first plate of the capacitor, semiconductor material 40 defines a second plate of the capacitor and dielectric 38 defines an electrical insulator therebetween. When topside 18 of semiconductor wafer 10 does not include dielectric 38, the contact between membrane 16 and topside 18 forms a Schottky test structure. For the purpose of describing the present invention, semiconductor wafer 10 will be described as including dielectric 38. However, this is not to be construed as limiting the invention.

The force with which membrane 16 contacts topside 18 of semiconductor wafer 10 is related to the pressure of the fluid in internal cavity 14. Similarly, the contact area between membrane 16 and topside 18 is related to the pressure of the fluid in cavity 14. Fluid pressure providing means 34 can include internal circuitry for measuring the pressure of fluid F in internal cavity 14. Utilizing this measured pressure, fluid pressure providing means 34 can control the force of membrane 16 in contact with topside 18 of semiconductor wafer 10 and the contact area of membrane 16 in contact with topside 18.

At a suitable time after membrane 16 is in contact with topside 18, electrical stimulus means 22 applies a suitable test stimulus between membrane 16 and chuck 4. Suitable test stimulus can include a capacitance-voltage (CV), current-voltage (IV), conductance-voltage (GV) or capacitance-time (Ct) type electrical stimulus. If the suitable test stimulus is CV-type electrical stimulus 24, electrical stimulus means 22 sweeps a DC voltage having an AC voltage superimposed thereon between first voltage 26 and second voltage 30. During application of CV-type electrical stimulus, measurement means 36 observes the change in the capacitance of the capacitor formed by membrane 16 and semiconductor wafer 10 from a maximum capacitance ($C_{max}$) 41 at first voltage 26 to a minimum capacitance ($C_{min}$) 42 at second voltage 30. At second voltage 30, the DC component of CV-type electrical stimulus 24 is terminated whereupon measurement means 36 observes an increase in capacitance of the capacitor formed by membrane 16 and semiconductor wafer 10 from $C_{min}$ 42 to $C_{max}$ 41. This increase in capacitance is shown by arrow 44 in FIG. 2.

The shape of CV-type electrical stimulus 24 and the time rate of change of the capacitance after termination of the DC voltage component of CV-type electrical stimulus 24 can be measured and correlated to the defect and impurity concentration of semiconductor material 40. The description of CV-type electrical stimulus 24 as being the suitable test stimulus is not to be construed as limiting the invention since any suitable test stimulus known in the art can be utilized.

Once testing is complete, fluid pressure providing means 34 reduces the pressure of fluid F in internal cavity 14 whereupon the resiliency of membrane 16 causes membrane 16 to contract away from topside 18 of semiconductor wafer 10. In response to fluid pressure providing means 34 reducing the fluid pressure in cavity 14 sufficiently, whereupon the fluid pressure on either side of membrane 16 is the same or nearly the same, membrane 16 will assume the relaxed position shown in FIG. 1.

As shown in phantom in FIG. 1, measurement probe 6 can also include an electrical conductor 46 at least partially surrounding probe body 12 in spaced relation thereto. Electrical conductor 46 can be maintained in spaced relation to probe body 12 by an electrical insulator 48 disposed between probe body 12 and electrical conductor 46. Electrical conductor 46 is desirably positioned adjacent the distal end of probe body 12. However, this is not to be construed as limiting the invention.

Electrical conductor 46 can be connected to an electrical ground 50. Alternatively, electrical conductor 46 can be connected to a bias means 52 which supplies to electrical conductor 46 an electrical signal which biases electrical conductor 46 to a suitable voltage to avoid the generation of unwanted electrons or holes in the area of semiconductor material 40 beneath electrical conductor 46.

While shown in the form of a washer surrounding probe body 12, electrical conductor 46 can have the form of a sleeve which extends along the length of probe body 12 and terminates adjacent the distal end thereof.

As can be seen, the present invention is a probe having an electrically conductive and elastic or resilient membrane that can be fluidly expanded into contact with the topside of a semiconductor wafer during testing of the semiconductor wafer. Once testing is complete, the fluid pressure can be reduced whereupon the resiliency of the membrane causes it to contract away from the semiconductor wafer.

The present invention has been described with reference to the preferred embodiments. Obvious modifications and alterations will occur to others upon reading and understanding the preceding detailed description. For example, probe body 12 and/or fluid F can be electrically conductive and membrane 16 can be electrically connected to electrical stimulus means 22 and measurement means 36 via probe body 12 or fluid F. It is intended that the invention be construed as including all such modifications and alterations insofar as they come within the scope of the appended claims or the equivalents thereof.

The invention claimed is:

1. A semiconductor wafer measuring apparatus comprising:
an electrically conductive wafer chuck for supporting a backside of a semiconductor wafer;
a probe having a probe body defining an internal cavity in fluid communication with an electrically conductive and elastic or resilient membrane;
means for moving the membrane and a topside of the semiconductor wafer into spaced relation when the wafer chuck is supporting the semiconductor wafer;
means for selectively controlling a pressure of fluid supplied to the cavity whereupon, in response to increasing the pressure of the fluid, the membrane expands into contact with the topside of the semiconductor wafer;
means for applying a test stimulus between the membrane and the semiconductor wafer; and
means for measuring the response of the semiconductor wafer to the test stimulus.

2. The apparatus of claim 1, wherein the membrane expands into contact with the topside of the semiconductor wafer at a force related to the pressure of the fluid.

3. The apparatus of claim 1, wherein, in response to decreasing the pressure of the fluid, the membrane contracts away from the topside of the semiconductor wafer.

4. The apparatus of claim 1, wherein the membrane and the wafer chuck are electrically connected to the test stimulus applying means.

5. The apparatus of claim 4, wherein:
at least one of the probe body and the fluid is electrically conductive; and
the membrane is electrically connected to at least one of the test stimulus applying means and the measuring means via the at least one of the probe body and the fluid.

6. The apparatus of claim 1, wherein:
the semiconductor wafer includes dielectric overlaying semiconductor material; and
the membrane expands into contact with the dielectric to form a capacitor whereupon the membrane defines a first plate of the capacitor, the semiconductor material defines a second plate of the capacitor and the dielectric defines an electrical insulator therebetween.

7. The apparatus of claim 1, further including:
an electrical conductor at least partially surrounding the probe body in spaced relation thereto; and
means for biasing the electrical conductor to a desired electrical potential.

8. The apparatus of claim 7, wherein the electrical conductor is positioned adjacent the membrane.

9. The apparatus of claim 7, further including an electrical insulator disposed between the electrical conductor and the probe body.

10. A method of testing a semiconductor wafer comprising:
(a) providing a probe having a probe body defining an internal cavity in fluid communication with an electrically conductive and elastic or resilient membrane;
(b) positioning the membrane in spaced relation with a topside of a semiconductor wafer;
(c) providing fluid to the cavity at a pressure sufficient to cause the membrane to expand into contact with the topside of the semiconductor wafer;
(d) applying a test stimulus between the membrane and the semiconductor wafer; and
(e) measuring a response of the semiconductor wafer to the test stimulus.

11. The method of claim 10, further including reducing the pressure of the fluid provided to the cavity sufficiently whereupon the elasticity of the membrane causes it to contract out of contact with the topside of the semiconductor wafer.

12. The method of claim 10, wherein:
at least one of the probe body and the fluid is electrically conductive; and
the membrane receives the test stimulus via the at least one of the probe body and the fluid.

13. The method of claim 10, wherein:
the semiconductor wafer includes dielectric overlaying semiconductor material; and
the membrane expands into contact with the dielectric to form a capacitor whereupon the membrane defines a first plate of the capacitor, the semiconductor material defines a second plate of the capacitor and the dielectric defines an electrical insulator therebetween.

14. The method of claim 10, further including:
providing an electrical conductor at least partially surrounding the probe body in spaced relation thereto; and
biasing the electrical conductor to a desired electrical potential.

15. The method of claim 14, wherein the electrical conductor is positioned adjacent the membrane.

16. The method of claim 14, further including providing an electrical insulator disposed between the electrical conductor and the probe body.

* * * * *